(12) United States Patent
Xia

(10) Patent No.: US 9,111,910 B2
(45) Date of Patent: Aug. 18, 2015

(54) HEAT DISSIPATION DEVICE WITH FIN SET

(75) Inventor: Ben-Fan Xia, KunShan (CN)

(73) Assignees: FURUI PRECISE COMPONENT (KUNSHAN) CO., LTD., Kunshan (CN); Foxconn Technology Co., Ltd., New Taipei (TW)

( * ) Notice: Subject to any disclaimer, the term of this patent is extended or adjusted under 35 U.S.C. 154(b) by 480 days.

(21) Appl. No.: 13/441,948

(22) Filed: Apr. 9, 2012

(65) Prior Publication Data
US 2013/0105121 A1    May 2, 2013

(51) Int. Cl.
| F28F 7/00 | (2006.01) |
|---|---|
| F28D 15/00 | (2006.01) |
| H05K 7/20 | (2006.01) |
| H01L 23/427 | (2006.01) |
| H01L 23/367 | (2006.01) |
| H01L 23/467 | (2006.01) |

(52) U.S. Cl.
CPC .......... *H01L 23/427* (2013.01); *H01L 23/3672* (2013.01); *H01L 23/467* (2013.01); *H01L 2924/0002* (2013.01)

(58) Field of Classification Search
CPC ............ F28D 15/0233; F28D 15/0275; H01L 23/427; H05K 7/20336
USPC ....................... 165/80.3, 185, 104.33, 104.21; 361/700, 704
See application file for complete search history.

(56) References Cited

U.S. PATENT DOCUMENTS

| 4,856,165 | A * | 8/1989 | Reuchlein et al. ........ 29/890.046 |
|---|---|---|---|
| 6,651,733 | B1 * | 11/2003 | Horng et al. .................. 165/80.3 |
| 2004/0182542 | A1 * | 9/2004 | Take et al. ..................... 165/80.3 |
| 2005/0039890 | A1 * | 2/2005 | Lee et al. .................. 165/104.33 |
| 2007/0006997 | A1 * | 1/2007 | Hsieh ........................ 165/104.33 |
| 2007/0023177 | A1 * | 2/2007 | Lee et al. ....................... 165/182 |
| 2007/0051501 | A1 * | 3/2007 | Wu et al. ................... 165/104.33 |
| 2008/0277455 | A1 * | 11/2008 | Hoffmann et al. ............ 228/183 |
| 2009/0229790 | A1 * | 9/2009 | Lu ................................. 165/80.3 |
| 2010/0025018 | A1 * | 2/2010 | Chen ........................ 165/104.33 |
| 2010/0206521 | A1 * | 8/2010 | Kwan ....................... 165/104.26 |
| 2011/0005726 | A1 * | 1/2011 | Zhang et al. ............. 165/104.26 |

* cited by examiner

*Primary Examiner* — Mohammad M Ali
*Assistant Examiner* — Erik Mendoza-Wilkenfel
(74) *Attorney, Agent, or Firm* — Novak Druce Connolly Bove + Quigg LLP

(57) ABSTRACT

A heat dissipation device includes a heat pipe and a fin set. The fin set includes a plurality of fins. Each of the fins includes a body, a first flange vertically extending from a top side of the body, and a second flange vertically extending from a bottom side of the body. The first flange has a first edge abutting a front neighboring fin and a second edge spaced to the first edge to define a slit. The first flange forms an extending portion extending from the second edge to define a gap between the extending portion and the body of the front neighboring fin. Each of the extending portions is soldered to the body of the front neighboring fin by solder filled in the gap between the extending portion and the body of the front neighboring fin from the slit.

12 Claims, 4 Drawing Sheets

HEAT DISSIPATION DEVICE WITH FIN SET

BACKGROUND

1. Technical Field

The disclosure relates to heat dissipation devices in electronics, and more particularly to a heat dissipation device with a fin set.

2. Description of Related Art

During operation of an electronic device such as a computer central processing unit (CPU), a large amount of heat is often produced. The heat must be quickly removed from the CPU to prevent it from becoming unstable or being damaged. Typically, a heat dissipation device is attached to an outer surface of the CPU to absorb the heat from the CPU.

Conventionally, a heat dissipation device in a limited space includes a solid metal base attached to the CPU, a heat pipe connected to the base, and a plurality of fins soldered to the heat pipe. However, ends of the heat pipe are shrunk to form a sealed structure. The outermost fins are difficult to be soldered to the shrunk ends of the heat pipe, which results in easily dropping of the outmost fins from the heat dissipation device and harming peripheral devices, such as the CPU.

What is needed, therefore, is a heat dissipation device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
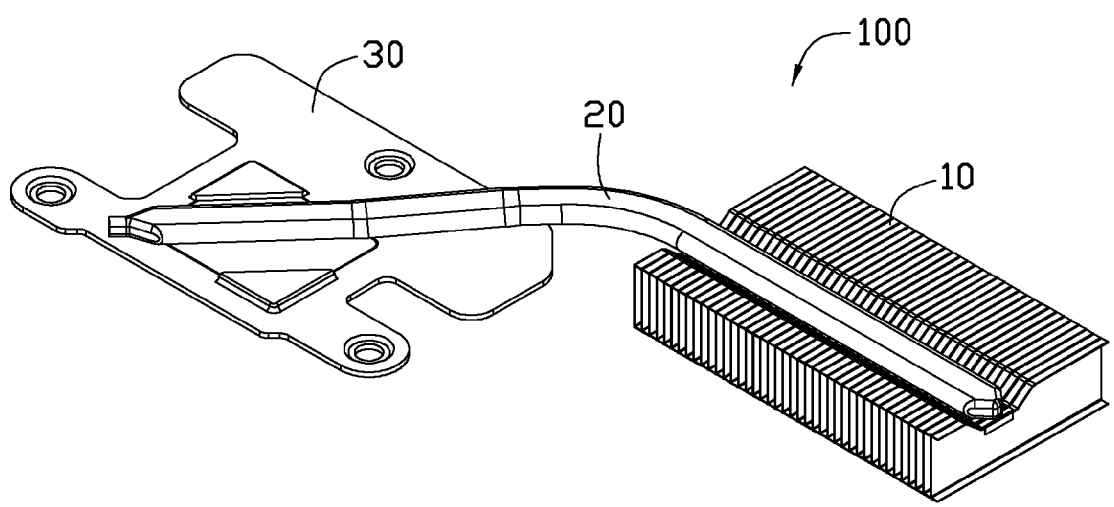
FIG. 1 is an assembled, isometric view of a heat dissipation device in accordance with an embodiment of the disclosure.
Figure 2:
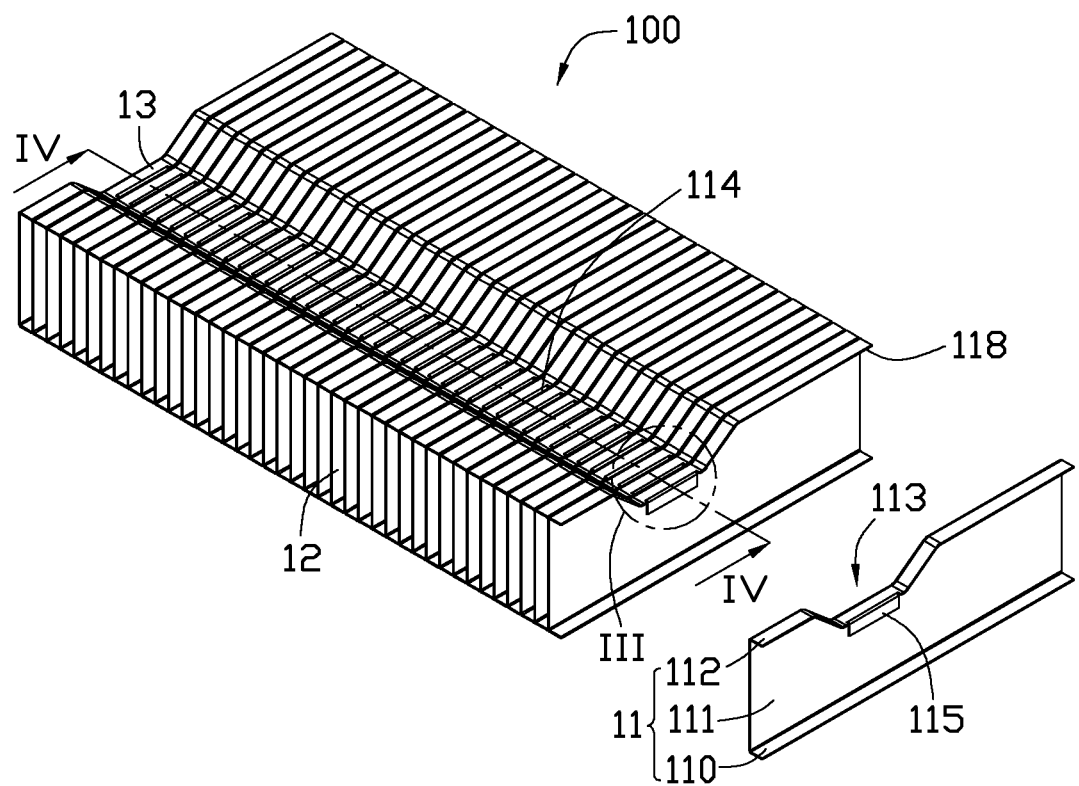
FIG. 2 is an exploded view of a heat sink of the heat dissipation device of FIG. 1.

Referring to FIGS. 1-2, a heat dissipation device 100 in accordance with an embodiment of the disclosure is shown. The heat dissipation device 100 is for thermally contacting an electronic component (not shown) mounted on a printed circuit board (not shown) to dissipate heat generated by the electronic component. The heat dissipation device 100 includes a fin set 10, a base 30 and a flat heat pipe 20 soldered on the fin set 10 and the base 30.

Figure 3:
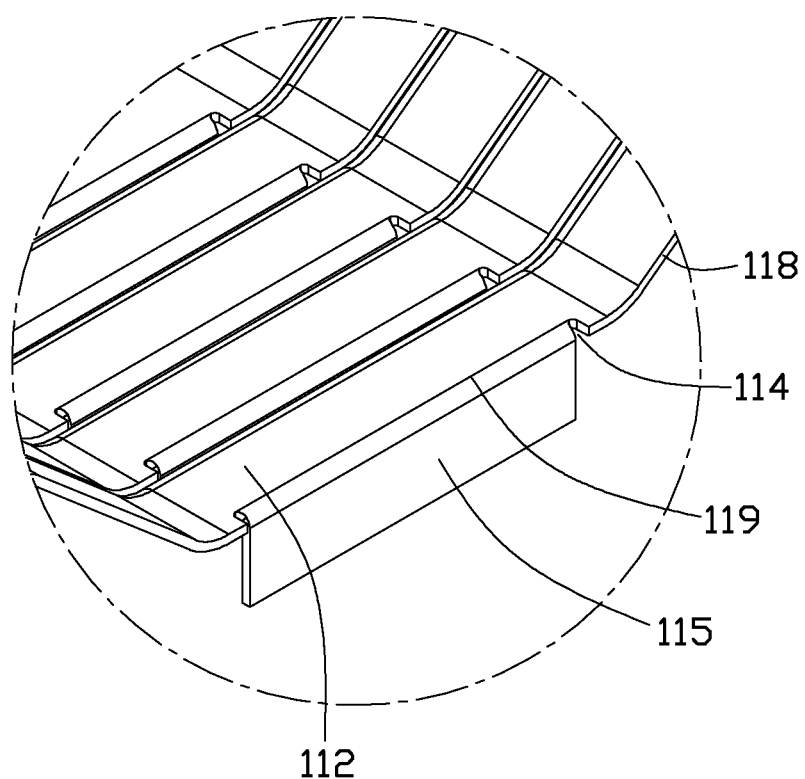
FIG. 3 is an enlarged view of a circled portion III of FIG. 2.
Figure 4:
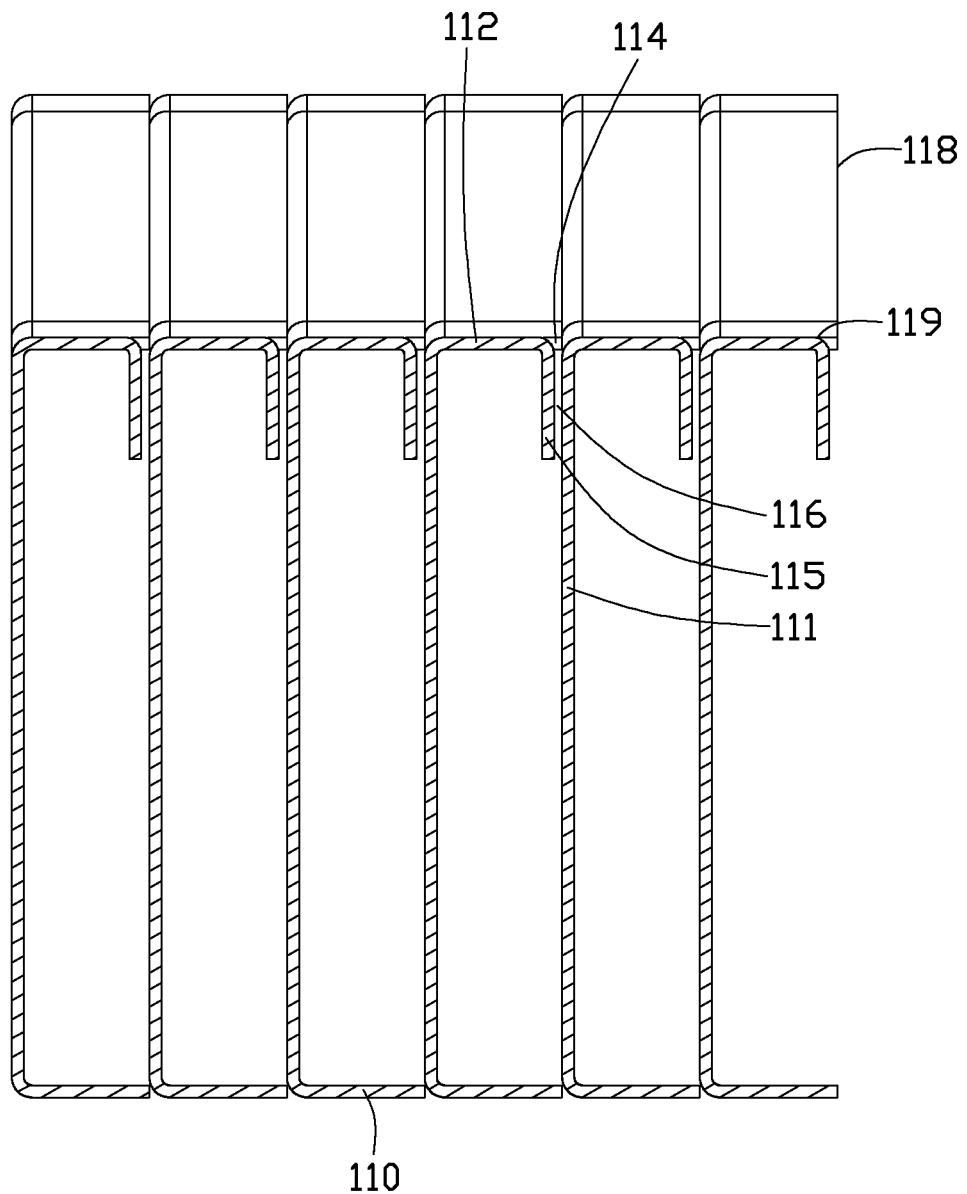
FIG. 4 is a cutaway, partial, side view of the fin set along a line IV-IV of FIG. 2.

Referring to FIG. 3 also, the fin set 10 includes a plurality of fins 11 juxtaposed to each other. Each of the fins 11 is punched by a metal piece having a good thermal conductivity. The fin 11 has an elongated and rectangular shape. The fin 11 includes a body 111, a first flange 112 vertically extending from a top side of the body 111, and a second flange 110 vertically extending from a bottom side of the body 111. The first flange 112 and the second flange 110 extend along a same direction. The second flanges 110 are flat and coplanar with each other. Each two neighboring fins 11 are juxtaposed to each other to form an air channel 12 therebetween. Each of the first flanges 112 has a concave portion 113 at a middle portion thereof. The concave portion 113 is lower than two ends of the first flange 112. A length of a bottom of the concave portion 113 is less than that of a top of the concave portion 113. The first flange 112 has a first edge 118 to contact the neighboring fin 11, and a second edge 119 in the concave portion 113. The second edge 119 is spaced to the first edge 118 with a small distance to define a slit 114. Each of the fins 11 forms an extending portion 115 vertically extending from the second edge 119 and parallel to the body 111 thereof.

When the fins 11 are assembled together, the first edge 118 of the first flange 112 abuts against a back surface of the body 111 of a front neighboring fin 11. A gap 116 is defined between the extending portion 115 and the body 111 of the front neighboring fin 11. In this embodiment, a width of the gap 116 between the extending portion 115 and the body 111 of the front neighboring fin 11 is about 0.05 mm~0.2 mm. The gap 116 communicates the slit 114. The concave portions 113 of the fins 11 cooperatively define a groove 13 of the fin set 10 to receive the heat pipe 20. The heat pipe 20 is soldered with the first flanges 112 in the groove 13 of the fin set 10. Simultaneously, the extending portions 115 of the fins 11 are soldered with the bodies 111 of the front neighboring fins 11 by solder flowing to the gaps 116 via the slits 114. The fins 11 are soldered to each other by large soldering area between the extending portions 115 and the bodies 111 of neighboring fins 11, whereby the fin set 10 is firm and the fins 11 at an outermost position of the fin set 10 are not easy to drop from the heat dissipation device 100.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:
   a heat pipe; and
   a fin set comprising a plurality of fins, each of the fins comprising a body, a first flange vertically extending from a top side of the body, and a second flange vertically extending from a bottom side of the body, the first flange having a first edge abutting a front neighboring fin and a second edge spaced to the first edge to define a slit passing through the first flange, the first flange forming an extending portion extending from the second edge to define a gap between the extending portion and the body of the front neighboring fin;
   wherein the first edge and the second edge are located at the same side of the first flange, the extending portion is an elongated plate and extends downwardly from the second edge and is perpendicularly to the first flange;
   wherein the first flanges of the fins are soldered to heat pipe, and each of the extending portions is soldered to the body of the front neighboring fin by solder filled in the gap between the extending portion and the body of the front neighboring fin from the slit;
   wherein each first flange has a concave portion at a middle portion thereof, the concave portion is lower than two ends of the first flange to receive the heat pipe;
   wherein a width of the part of the first flange located at the bottom of the concave portion is less than other parts of the first flange located at opposites of the part of the first flange.

2. The heat dissipation device of claim 1, wherein a length of a bottom of the concave portion is less than that of a top of the concave portion.

3. The heat dissipation device of claim 1, wherein the extending portion of each of the fins is parallel to the body of the front neighboring fin.

4. The heat dissipation device of claim 3, wherein a width of the gap is 0.05 mm~0.2 mm.

5. A fin set comprising:
a plurality of fins each comprising a body, a first flange vertically extending from a top side of the body, and a second flange vertically extending from a bottom side of the body, the first flange having a first edge abutting a front neighboring fin and a second edge spaced to the first edge to define a slit passing through the first flange, the first flange forming an extending portion extending from the second edge to define a gap between the extending portion and the body of the front neighboring fin;
wherein the first edge and the second edge are located at the same side of the first flange, the extending portion is an elongated plate and extends downwardly from the second edge and is perpendicularly to the first flange;
wherein each of the extending portions is soldered to the body of the front neighboring fin by solder filled in the gap between the extending portion and the body of the front neighboring fin from the slit;
wherein each first flange has a concave portion at a middle portion thereof, the concave portion is lower than two ends of the first flange to receive the heat pipe;
wherein a width of the part of the first flange located at the bottom of the concave portion is less than other parts of the first flange located at opposites of the part of the first flange.

6. The fin set of claim 5, wherein each of the first flanges has a concave portion at a middle portion thereof, the concave portion being lower than two ends of the first flange.

7. The fin set of claim 6, wherein a length of a bottom of the concave portion is less than that of a top of the concave portion.

8. The fin set of claim 5, wherein the extending portion of each of the fins is parallel to the body of the front neighboring fin.

9. The fin set of claim 8, wherein a width of the gap is 0.05 mm~0.2 mm.

10. A heat dissipation device comprising:
a heat pipe; and
a fin set comprising a plurality of fins soldered to the heat pipe, each of the fins comprising a body, a flange vertically extending from a side of the body, the flange having a first edge abutting a front neighboring fin and a second edge spaced to the first edge to define a slit passing through the first flange, the flange forming an extending portion extending from the second edge, the extending portion being spaced from the body of the front neighboring fin by solder filled between the extending portion and the body of the front neighboring fin;
wherein the first edge and the second edge are located at the same side of the first flange, the extending portion is an elongated plate and extends downwardly from the second edge and is perpendicularly to the first flange;
wherein each first flange has a concave portion at a middle portion thereof, the concave portion is lower than two ends of the first flange to receive the heat pipe;
wherein a width of the part of the first flange located at the bottom of the concave portion is less than other parts of the first flange located at opposites of the part of the first flange.

11. The heat dissipation device of claim 10, wherein the extending portion of each of the fins is soldered to the body of the front neighboring fin by the solder filled between the extending portion and the body of the front neighboring fin.

12. The heat dissipation device of claim 11, wherein the solder is filled between the extending portion and the body of the front neighboring fin via the slit.

* * * * *